United States Patent
Mora Barrios

(10) Patent No.: US 11,385,541 B2
(45) Date of Patent: Jul. 12, 2022

(54) RADIATION-CURABLE RESIN COMPOSITION AND PRODUCTION METHOD THEREOF

(71) Applicant: CENTRO TECNOLOGICO DE NANOMATERIALES AVANZADOS, S.L., Madrid (ES)

(72) Inventor: Karla Daniela Mora Barrios, Madrid (ES)

(73) Assignee: Centro Tecnologico De Nanomateriales Avanzados, S.L., Madrid (ES)

(*) Notice: Subject to any disclaimer, the term of this patent is extended or adjusted under 35 U.S.C. 154(b) by 337 days.

(21) Appl. No.: 16/499,414

(22) PCT Filed: Apr. 2, 2018

(86) PCT No.: PCT/ES2018/000039
§ 371 (c)(1),
(2) Date: Sep. 30, 2019

(87) PCT Pub. No.: WO2018/178423
PCT Pub. Date: Oct. 4, 2018

(65) Prior Publication Data
US 2020/0026185 A1    Jan. 23, 2020

(30) Foreign Application Priority Data
Mar. 31, 2017 (ES) ................ ES201700369

(51) Int. Cl.
*G03F 7/00* (2006.01)
*C08K 3/04* (2006.01)
(Continued)

(52) U.S. Cl.
CPC .......... *G03F 7/0037* (2013.01); *C08F 283/10* (2013.01); *C08J 3/005* (2013.01); *C08J 3/28* (2013.01); *C08J 7/12* (2013.01); *C08K 3/042* (2017.05); *C08K 3/346* (2013.01); *C08K 7/04* (2013.01); *C08L 33/12* (2013.01); *C08L 63/00* (2013.01); *C08L 67/00* (2013.01); *C08L 71/00* (2013.01); *C08L 75/04* (2013.01); *B33Y 70/00* (2014.12); *B33Y 80/00* (2014.12)

(58) Field of Classification Search
CPC .......... C08L 71/00; C08L 47/00; C08L 35/00; C08L 63/00–10; C08L 33/12; C09D 171/00; C09D 147/00; C09D 135/00; C09D 163/00–10; C09J 171/00; C09J 147/00; C09J 135/00; C09J 163/00–10; G03F 7/0037; B33Y 70/00; C08K 3/042; C08K 3/346
See application file for complete search history.

(56) References Cited

U.S. PATENT DOCUMENTS

2001/0046642 A1* 11/2001 Johnson ................ G03F 7/0037
522/170

* cited by examiner

*Primary Examiner* — Kregg T Brooks
(74) *Attorney, Agent, or Firm* — Bay State IP, LLC

(57) ABSTRACT

A radiation-curable resin composition, suitable for use in 3D printing, and to the production method thereof, i.e. the method for producing three-dimensional objects using radiation by means of 3D printing of the laser, DLP or LCD type, with successive photopolymerisable layers. The radiation-curable resin composition comprises one or more epoxy-acrylic resins and polymethyl methacrylate, graphene, halloysite nanotubes and one or more photoinitiators.

14 Claims, 2 Drawing Sheets

(51) Int. Cl.
*C08F 283/10* (2006.01)
*C08J 3/00* (2006.01)
*C08J 3/28* (2006.01)
*C08J 7/12* (2006.01)
*C08K 3/34* (2006.01)
*C08K 7/04* (2006.01)
*C08L 33/12* (2006.01)
*C08L 63/00* (2006.01)
*C08L 67/00* (2006.01)
*C08L 71/00* (2006.01)
*C08L 75/04* (2006.01)
*B33Y 70/00* (2020.01)
*B33Y 80/00* (2015.01)

RADIATION-CURABLE RESIN COMPOSITION AND PRODUCTION METHOD THEREOF

CROSS REFERENCE TO RELATED APPLICATION

This application is for entry into the U.S. National Phase under § 371 for International Application No. PCT/ES2018/000039 having an international filing date of Apr. 2, 2018, and from which priority is claimed under all applicable sections of Title 35 of the United States Code including, but not limited to, Sections 120, 363, and 365(c) and which in turn claims priority under 35 USC 119 to Spanish Patent Application No. P201700369 filed on Mar. 31, 2017.

SUBJECT MATTER OF THE INVENTION

One of the subject matters of the present invention is a novel radiation curable resin with the main application being to obtain three-dimensional objects through stereolithography, which is comprised of at least one epoxy-acrylic resin, polymethyl methacrylate, graphene, halloysite nanotubes, and one or more photoinitiators. Another subject matter of the invention is also a novel procedure for obtaining it.

BACKGROUND OF THE INVENTION

The complex manufacture of three-dimensional objects by means of 3D printing or stereolithography has long been known, and the radiation-curable liquid composites (laser-cured, DLP, or LCD) used have to meet a number of requirements, such as those set forth in the following patent documents.

The requester does not know of any composition of a radiation curable resin, as claimed in the present application, that is suitable for use in 3D printing.

U.S. Pat. No. 5,476,748. Compositions of hybrid systems, photopolymerizable either cationically or with free radicals, and have been found in said patent. It was shown that said systems provide the required balance of accuracy, speed, and final properties. The disclosed compositions comprise at least:

from 40% to 80% by weight of a difunctional or greater functionality liquid epoxy resin or a liquid mixture consisting of difunctional or greater functionality epoxy resins.
from 0.1% to 10% by weight of a cationic photoinitiator or a mixture of cationic photoinitiators.
from 0.1% to 10% by weight of a free-radical photoinitiator or a mixture of free-radical photoinitiators.
from 5% to 40% by weight of a determined hydroxylated compound.
from 0% to 15% by weight of at least one liquid poly(meth)acrylate with a (meth)acrylate functionality greater than 2.
from 5% to 40% by weight of at least one aromatic cycloaliphatic liquid diacrylate, with the content of component (E) being no greater than 50% by weight of the total content of (meth)acrylate.

In another patent, U.S. Pat. No. 5,972,563, a radiation curable liquid composition is disclosed, which further comprises a free-radical polymerizable liquid component, and comprised of at least the following additional components:

from 40% to 80% by weight of a difunctional or greater functionality liquid epoxy resin or of a liquid mixture consisting of difunctional or greater functionality epoxy resins.
from 0.1% to 10% by weight of a cationic photoinitiator or a mixture of cationic photoinitiators.
from 0.1% to 10% by weight of a free-radical photoinitiator or a mixture of free-radical photoinitiators
from 2% to 40% by weight of a hydroxylated compound.
the free-radical polymerizable component comprises at least 4% to 30% by weight of at least one liquid poly(meth)acrylate, which has a functionality of (meth)acrylate greater than 2.
one or more di(meth)acrylates, preferably in an amount of 5% to 40% by weight.

Another patent, U.S. Pat. No. 5,605,941, discloses a methodology for producing three-dimensional objects. Each of the photopolymerizable compositions is resistant in its crude form and has excellently balanced final thermomechanical properties. Requesters of this invention have now surprisingly found that the selected hybrid compositions are capable of producing cured objects through stereolithography process systems with improved properties without the use of a free-radical photoinitiator. The composition is comprised of:

(A) 40% to 80% by weight of a polyfunctional liquid component, which has at least two groups capable of reacting with a ring opening mechanism to form a polymer lattice.
(8) 0.1% to 10% by weight of a cationic photoinitiator or a mixture of cationic photoinitiators.
(C) 2% to 30% by weight of a compound with at least one unsaturated group and at least one hydroxy group in its molecule.
(D) 0% to 40% by weight of a hydroxylated compound that has no unsaturated group.
(E) 0% to 30% by weight of at least one liquid poly(meth)acrylate having a functionality greater than 2 and lacking hydroxy groups.
(F) 0% to 40% by weight of at least one cycloaliphatic or aromatic di(meth)acrylate liquid lacking hydroxy groups.
(G) 0% to 10% by weight of a reactive diluent, wherein the sum of components (A), (B), (C), (D), (E), (F) and (G) is 100% by weight, and components (C), (D), (E), (F) and (G) are different and the composition does not contain any amount of free-radical initiators.

The patent, JP 20 75,618, discloses mixtures of an epoxy resin, an acrylate, a cationic photoinitiator, and one radical, as well as a polyester with terminal OH groups. The acrylate component used contains at least 50% of an acrylic monomer provided with more than 3 double bonds.

The patent, EP-A-360 869, publishes a mixture of resins to be moulded with the light that contains a cationic cross-linkable and polymerizable organic compound, as well as a cationic photoinitiator, taking into account that other free-radical polymerizable components, e.g. polyacrylates, can also be used simultaneously.

The patent, ES2100513T3, mentions the following: mixed at 60° C. 55 g of 3',4'-3,4-epoxycyclohexylmethyl epoxycyclohexanecarboxylate with 18 g of a trifunctional polycaprolactone with terminal OH groups (TONER Polyol 0301 from Union Carbide) and 12 g of ethoxylated bisphenol A diacrylate (SRR 349 from Sartomer). Next, 1 g of 1-hydroxycyclohexyl phenyl ketone (Irgacure® 184 from the Ciba-Geigy company) and 1 g of triarylsulfonium hexafluoroantimonate (Cyracure UVI 6974 of the Union Carbide company), then stirred until a transparent and homogeneous mixture is formed. The liquid formulation has a viscosity of 138 mPa·s at 30° C. The moulded parts are manufactured with an HeCd laser (radiation energy: 320 mJ/cm2). Then, the laser crosslinking (crude parts); said parts have the following properties: modulus of elasticity: 1320 N/mm2 rupture elongation: 6.4%.

For complete crosslinking, the crude pieces are exposed to UV light for 30 minutes and heated at 130° C. for 30 minutes. The pieces have these properties: modulus of elasticity: 1580 N/mm2 rupture elongation: 4.3% warping factor (curl): CF 6: 0.01 CF 11: 0.02.

The patent, ES2345031T3, mentions that the mechanical strength of the crude model (modulus of elasticity, resistance to fracture), which is also referred to as crude resistance, constitutes an important property of the crude model and is essentially determined by the nature of the liquid resin composition for the 3D or stereolithographic printing used.

The patent, U.S. Pat. No. 5,476,748, discloses a composition of a radiation curable resin comprised of a liquid epoxy resin of a functionality greater than or equal to 2 and between 40 and 80%, preferably between 50 and 75%, a liquid poly(meth)acrylate between 0 and 15%, preferably between 0 and 20%, a cationic photoinitiator between 0.1 and 10%, preferably between 0.2 and 0.5%, a radical photoinitiator between 0.1 and 10%, preferably between 0.2 and 0.5%, a polyether, polyester, or polyurethane type compound with terminal hydroxyl groups composing between 5 and 40%, preferably between 10 and 40%, and a compound having at least one unsaturated group and at least one hydroxy group between 5 and 40%, preferably between 5 and 20%. In addition to these components, the composition may incorporate other additives and fillers.

The Rasheed Atif informative article, entitled "Fractography analysis of 0.5% multilayer Graphene/nanoclay reinforced epoxy nanocomposites," discusses the incorporation of graphene and haloisite nanotubes in curable resin compositions in order to improve their mechanical properties Moreover, graphene is one of the hardest known materials, being the ideal candidate for reinforcement in a high-performance curable liquid resin. It has been found that some materials can qualitatively improve their properties by adding graphene and analogues to them, as in the case of light-curing resins, where it has been unambiguously demonstrated that the stress transfer takes place from the polymer matrix to the graphene monolayer, showing that graphene acts as a reinforcement phase. Another significant advantage is that the warping or contracting effect of the nanocomposite during photopolymerization is almost imperceptible upon adding said reinforcement.

Graphene is the most stable allotrope of coal, under standard conditions of pressure and temperature. Its structure is formed by a huge stack of superimposed sheets on top of each other, within which the atoms form hexagonal cells through covalent bonds of 1.42 A.

Graphite oxide (GO), is a compound obtained by the oxidation of graphite by a strong oxidant and in the presence of nitric acid, of which the sheets consist of a two-dimensional carbonaceous skeleton, formed by a large number of sp3 carbons and a small number of sp2 carbons. During oxidation, the graphite structure is maintained, although the aromatic character is partially lost. The structure contains different amounts of functional groups such as hydroxyl, ether, carboxylic groups, ketone groups, etc. with the proposed formula for this compound being C7O4H2. The GO forms stable dispersions in water, where a single sheet of GO can be detected. Some researchers have observed that interlaminar spacing increases from 0.3 nm to 1.23 nm when the GO is dispersed in 0.05 N of an NaOH solution, it can be considered fully exfoliated for 0.01 N of NaOH solutions. Consequently, the GO presents an interesting intercalation chemistry (GICs), offering many possibilities to obtain different nanocomposites.

In fact, similar to sheeted solids, such as natural silicates, graphite can be exfoliated. The exfoliation consists of the separation of the individual graphite sheets and is achieved by a thermal shock at a high temperature (~1000° C.) or with microwaves, eliminating the interleaving or the oxidized components of GO through sudden volatilization, achieving a unidirectional extension of the initial sheets.

In this sense, recent publications show substantial improvements of some properties, such as, for example, a decrease in the coefficient of thermal expansion (CTE) and an increase in the modulus of elasticity. It should be noted that the reinforcement of the nanocomposite, mixed with an appropriate amount of halloysite nanotubes, could significantly increase impact resistance without sacrificing the flex modulus, resistance, and thermal stability.

In relation to halloysite nanotubes, and in contrast to other inorganic nanomaterials used as fillers in polymeric matrices, these can be obtained easily and are much cheaper. Its unique crystalline structure, similar to that of carbon nanotubes (CNT), as far as geometry is concerned, makes these materials potential substitutes.

Moreover, presenting chemical-physical characteristics similar to laminar clays, they have the advantage that they do not need to be exfoliated inside the polymer, potentially improving their final properties. Finally, the size of the internal diameter of the nanotubes makes halloysite a material with such potential applications as an encapsulant (host system) of small molecules, such as different types of pharmaceuticals, and may be useful for the controlled release of different types of substances.

Halloysite is made up of aluminium-silicate nanotubes. It is a completely natural nanomaterial, composed of a double layer of aluminium, silicon, hydrogen, and oxygen. They are geometrically very fine tubular particles (FIG. 1 right), whose dimensions are about 50 nm internal diameter and approximately 500 nm to 1.2 µm long. Among the advantages of these nanotubes are their biocompatibility, natural origin, low toxicity, large surface area, high capacity for cation exchange, and are economical.

Taking into account all these characteristics, it seems reasonable to believe that halloysite nanotubes are good candidates to use as polymer matrix fillers to improve, among other things, their fracture resistance.

There are studies that demonstrate this improvement if the matrices are epoxy-based thermosetting polymers. However, none of the research papers that have been found are focused on dental applications, which makes it an even more attractive proposal in the production of three-dimensional objects through 3D printing in dental applications.

The large surface area of these nanotubes influences the dispersion in the polymeric matrices throughout their processing, promoting the homogenization of the final composite material. In general, they have a great tendency to form aggregates and even agglomerate through favourable interparticle interactions (possibility to form hydrogen bonds among hydroxyl groups).

DESCRIPTION OF THE INVENTION

The radiation curable resin composition, which is one of the subject matters of the present invention, is comprised of one or more epoxy-acrylic and polymethylmethacrylate resins, graphene, halloysite nanotubes, and one or more photoinitiators.

PREFERRED IMPLEMENTATION

Figure 1:
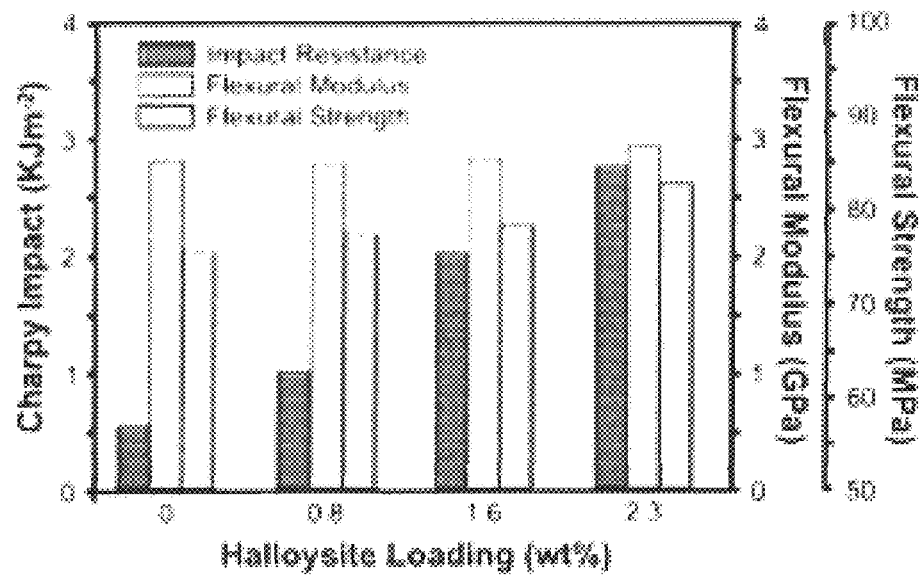
FIG. 1. Flexural Strength 11 High-impact nanocomposites made of epoxy resin reinforced with natural nanotubes" Polymer, 48: 6426-6433 (2007).
Figure 2:
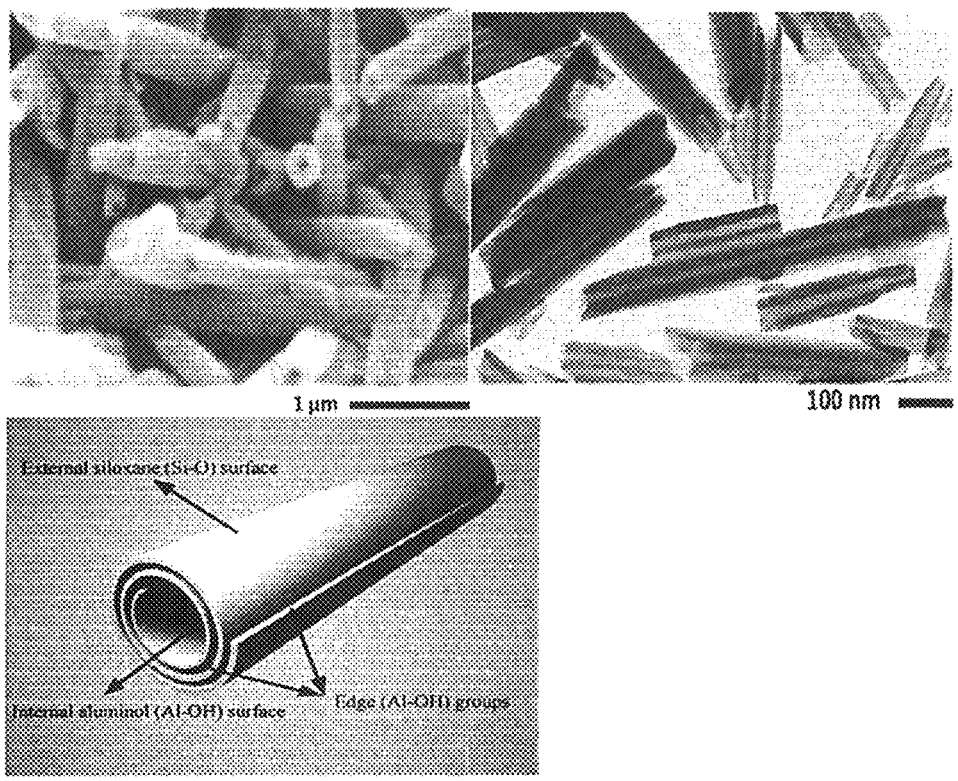
FIG. 2. Geometric structure and dimensions of halloysite nanotubes. Halloysite is made up of aluminium-silicate nanotubes. Its composition is comprised of a double layer of aluminium, silicon, hydrogen, and oxygen (FIG. 1 left). They are geometrically very fine tubular particles (FIG. 1 right), with dimensions of about 50 nm internal diameter and approximately 500 nm to 1.2 μm long.
Figure 3:
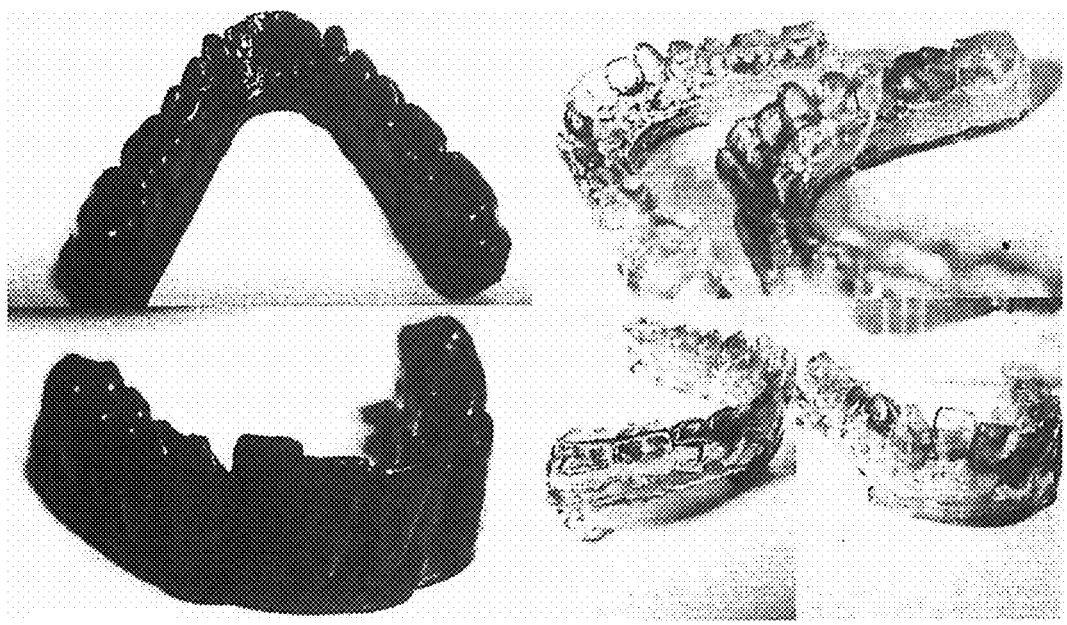
FIG. 3. The printing of models printed on DLP is valuable, with different percentages of nano-reinforcement. In which we observe a more transparent model with a 5% load and a greyish model with 20% of weight content.

A preferred implementation of the radiation curable resin composition is composed of:
(A) 40% to 60% by weight of at least one liquid epoxy resin, difunctional or greater functionality epoxy greater than or equal to 2,
(B) 0.1% to 40% by weight of at least one liquid poly(meth)acrylate, of one (meth)acrylate functionality. (B) will be a maximum of 50% by weight of the total content of (meth)acrylate,
(C) 0.1% to 10% by weight of at least one cationic photoinitiator for the component
(D) 0.1% to 10% by weight of at least one radical photoinitiator for the components
(E) 5% to 15% by weight of at least one polyether, polyester, or polyurethane provided with terminal OH groups.
(F) 2% to 30% by weight of a compound having at least one unsaturated group and at least one hydroxy group in its molecule,
(G) 0% to 30% by weight of a hydroxylated compound that has no unsaturated group,
(H) 0.1% to 5% graphene oxide or functionalized graphene with an adhesive component.
(I) other reinforcement materials, such as halloysite nanotubes, have been included, between 0.1% to 20% by weight.

The total sum of the compounds is equal to 100% by weight.

The use of graphene or functionalized graphene is related to the polymer-graphene-polymer structures and with complex multilayer structures with repeated layers of graphene and polymer substrate. The insertion of graphene or functionalized graphene into the nanocomposite of curable liquid resin has advantageous properties. It does not undergo thermal expansion.

Other reinforcement materials have been included, such as halloysite nanotubes, between 0.1% and 20% by weight, which can also be included in the multilayer structure (polymer-graphene-halloysite nanotubes-polymer), as required.

The invention of the polymer-based curable liquid resin with an epoxy/acrylic resin base, preferably for dental use, reinforced with graphene or functionalized graphene and halloysite nanotubes, has been used to improve the mechanical properties of the polymer matrix.

The surface of the substrate on which graphene is applied is substantially flat. Nevertheless, the methods of the present invention are applicable to irregular surfaces, such as surfaces containing peaks, depressions, and/or undulations.

In a preferred implementation, the thickness of the graphene or functionalized graphene and the adhesive component to adhere the graphene or functionalized graphene to the substrate may be as small as 100 nm.

In another preferred implementation, the curable liquid resin is comprised of graphene or functionalized graphene and halloysite nanotubes incorporated into the substrate. Typically, in this implementation, it is not necessary for said resin to contain an adhesive component. However, ideally, to ensure good adhesion and graphene retention, it is important that the polarity of the curable liquid resin is compatible with graphene and halloysite nanotubes.

In another implementation, the curable liquid resin may contain graphene that has not been previously chemically modified (virgin graphene), or contain functionalized graphene (graphene that has been chemically modified, such as graphene oxide), the latter being an alternative implementation.

In the field of 3D printing (laser, DLP, or LCD) or stereolithography, the hybrid composition that translates into chemical mixtures of cationically or free-radical curable components is understood.

In this invention, ring opening is cationically activated for epoxides, and for (meth)acrylate, it is activated by free radicals. The essential characteristic of the composition of this invention is the presence of an amount of a compound having at least one unsaturated terminal and/or pendant group and at least one hydroxyl group in its molecule together with a conventional cationically curable component.

Preferred compounds having at least one terminal unsaturated and/or pendant group and at least one hydroxyl group are mono- and polyhydroxyacrylates, mono- and polyhydroxymethacrylates, and mono- and polyhydroxyvinyl ethers. There are some examples of conventional cationically curable components, which are compounds that are polymerized by a ring opening reaction, such as epoxides, oxetanes, and tetrahydropyran. The liquid, consisting of a polyfunctional compound that has at least two groups capable of reacting by or as a result of a ring opening mechanism to form a polymer lattice, which is used in the new compositions, are conveniently resins, which are liquid at room temperature and cationically activated.

The resins may have an aliphatic, aromatic, cycloaliphatic, or heterocyclic structure; they contain the cyclic groups as lateral groups, or the epoxy group, which can be part of a system of alicyclic or heterocyclic rings. Resins of these types are known in general terms and are commercially available, in such resins, preferably, component (A) contains oxirane (epoxide) rings in the molecule.

Poly glycidyl and poly (13-methylglycidyl) esters are some epoxy resins.

You can also use poly(glycidyl ethers) or poly[(13-methylglycyl) ethers], which can be obtained by reacting a compound having at least two free alcoholic hydroxyl groups and/or phenolic hydroxyl groups with an epichlorohydrin conveniently substituted under alkaline conditions or in the presence of an acid catalyst, followed by treatment with alkali. Particularly important representatives of poly (glycidyl ethers) or poly((3-methylglycidyl ethers) are based on phenols, either in monocyclic phenols, or polycyclic phenols; for example, in bis(4-hydroxyphenyl)methane (bisphenol F), 2,2-bis (4-hydroxyphenyl) propane (bisphenol A), or in condensation products, obtained under acidic conditions, of phenols or cresols with formaldehyde.

The present invention has been based on bisphenol A and bisphenol F and mixtures of them. It has been obtained by dehydrochlorination of the reaction products of epichlorohydrin with amines containing at least two amino hydrogen atoms. The poly(S-glycidyl) compound is suitable for component (A) of the new composition; some examples of epoxy compounds that are part of an alicyclic or heterocyclic ring system include 2-(3,4-epoxycyclohexyl-5,5-spiro-3,4-epoxy)cyclohexane-1,3-dioxane, bis(2,3-epoxycyclopentyl) ether, 2,3-epoxycyclopentyl glycidyl ether, 1,2-bis (2,3-epoxycyclopentyloxy)ethane, ethylenebis (3,4-epoxycyclohexane)-carboxylate, ethanediol-di (3,4-epoxycyclohexylmethyl)-ether, vinylcyclohexene dioxide, dicyclopentadiene diepoxide, bis(4-hydroxycyclohexyl) methane diglycidyl ether, 2,2-bis (4-hydroxycyclohexyl propane diglycidyl ether, 3,4-epoxycyclohexyl methyl-3,4-poxycyclohexanecarboxylate, 3,4-epoxy-6-methyl-cyclohexylmethyl-3,4-epoxy-6-methylcyclohexanecarboxylate, di(3,4-epoxycyclohexylmethyl)-hexanedioate, di(3,4-epoxy-6-methylcyclohexylmethyl)-hexanedioate.

Component (A) contains between 40% and 60% by weight. Component (B) contains between 0% and 40% by weight. As for component (C), there is a range of cationic photoinitiators known industrially for curable liquid resins, such as onium salts, with weakly nucleophilic anions.

They are found in various inventions, such as EP-A-0044274, EP-A-0054509, EP-A-0153904, EP-A-0035969, EP A-0164314 and U.S. Pat. No. 3,708,296.

The photoinitiator (C) and (O) is in amounts of 0.1% to 10% by total weight. In 3D or stereolithographic printing, laser beams are normally used; it is essential that the absorption capacity of the composition be adjusted so that the curing intensity for the normal laser rate is approximately 0.1 to 2.5 mm high.

The intention is that the invention contain various photoinitiators of different sensitivity to light radiation in terms of wavelength. The purpose is that it produce optimal optical absorption. An interesting aspect is that the optimum level of cationic photoinitiator is between 2% and 8% in relation to the total weight of the photoinitiators.

Component (E) is present in an amount of at least 5% by weight based on the total weight of the composition.

Success has also been achieved in solving the challenge of a new composition for printing in 3D (laser or DLP) or stereolithography, whose cured object-models exhibit greater tensile strength, impact resistance, and elongation at break. This was achieved with the reinforcement of nanotube nanoparticles of halloysite and graphene or functionalized graphene.

The amount of graphene or functionalized graphene added to the nanocomposite is 0.1% to 5% of the total weight.

In the present invention, a method of improving the mechanical properties of the curable liquid resin is provided; said improvement includes an increase in the strength and hardness modulus. Said increase is raised by 10%, and may even reach 100% or more; consequently, the strain hardening of the curable liquid resin involves stress delivery cycles.

In addition, there are also significant improvements in density, crystallinity, light absorption, and luminescence as optical properties, damping capacity, and stability to pH changes.

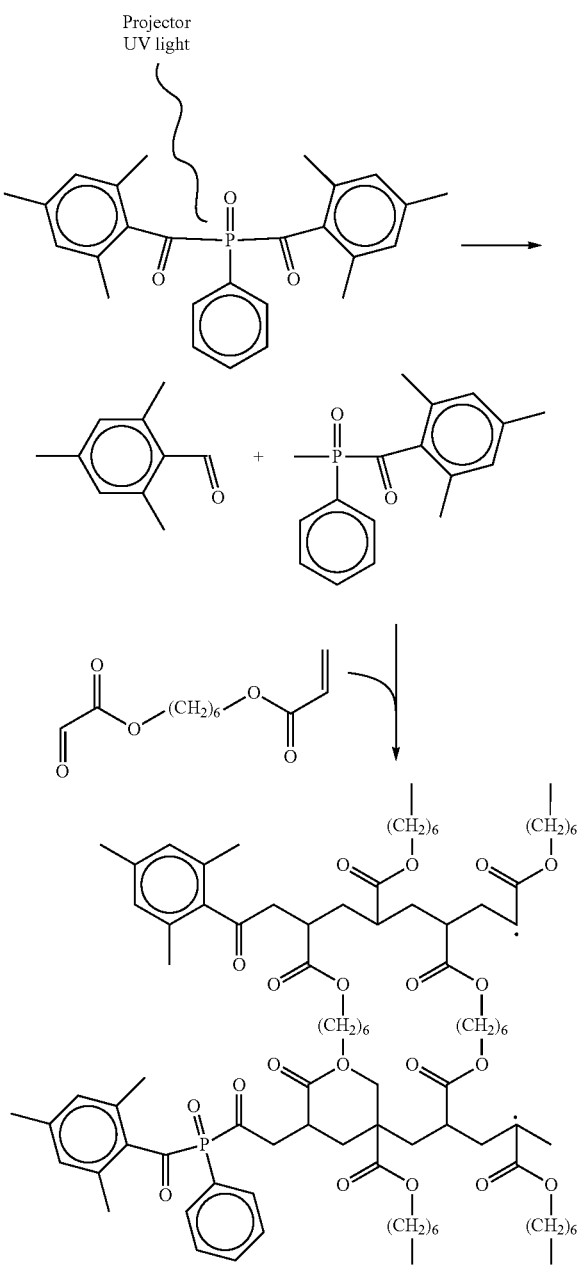

Diagram of the reaction for the ultraviolet divided initiator of the liquid resin, when coming into contact with UV light, when the photopolymerization occurs.

In the present invention, it is mentioned that other important properties of this invention, not present in the aforementioned patents, are a high sensitivity for the radiation used in the process of curing and an almost imperceptible warping factor, which allows for a high definition of the shape of the crude model. In addition, for example, the pre-cured layers of material are easily wetted between layers due to the composition of the curable liquid resin and, of course, not only in the raw model, but also the finished article has superior mechanical properties.

The process of preparing the radiation curable resin composition was divided into three stages:
i) polymer blend
ii) reinforcement with nanoparticles iii) 3D printing to obtain the three-dimensional object.

i) To mix the components of (A) and (G), previously weighed with an electronic scale, stir them with a magnetic mixer between 200 rpm and 800 rpm, for 3 days; to improve the mixture even more, add magnetic pads. Afterwards, take the mixture to an opaque, sterile container.

ii) In the context of the present invention, once the initial mixture of the curable liquid resin is obtained, proceed to weigh the reinforcing materials—in this case, the graphene or functionalized graphene and the halloysite nanotubes. These are taken to be be ultrasonically stirred to achieve a homogenization of the mixture at the percentages already described. The ultrasonic bath was performed with a nominal frequency of between 25 and 45 kHz, at room temperature and for a range of 3 to 6 hours, during which time an average temperature of between 35° C. and 60° C. was maintained; the effect is that it manifested as a gel and the prepolymerization stage was completed.

The radiation curable liquid resin composition is a homogeneous mixture with different proportions of reinforcements, which may contain a higher percentage of graphene or functionalized graphene with halloysite nanotubes on a larger or smaller scale. Thus, the invention is also related to structures such as graphene, halotysite nanotubes, and complex structures with repeated layers of nano-reinforcements and polymer matrices. Thus, the structure offers us a reinforced curable liquid resin, with numerous advantages and great stability, both thermal and dimensional.

iii) 3D printing is done through a 3D printer, so kinetic and/or free-radical type photoinitiators were used. They absorb ultraviolet (UV) photons, which the 3D printer projector emits at a certain wavelength. The free radicals, when exposed to the light, begin to react with the curable liquid resin and start the polymerization. To induce polymerization, it is necessary that the projector light is focused and suitably aligned in relation to the polymerization pool.

The 3D object is created from the union of different layers that are photopolymerized with each other as the light strikes them. The resolution of the created objects is between 0.02 and 0.05 µm.

During the exposure of the object to be created to the light, the exothermic reaction must be considered, and that involves the nature of the reaction itself. Large cross sections tend to create a warping effect, because, due to the increase in temperature, a polymerization reaction is caused that causes the object to expand. To avoid this warping effect, dynamic parameters should be applied to the curing and the exposure time should be lowered in the printing program software, so as to avoid overexposure and obtain the final model.

The construction or printing of three-dimensional (3D) objects based on models designed by a computer use a power source, laser type DLP or LCD, to draw a cross-section.

The printing area is carried out along the X and Y axes, creating the object layer by layer and pixel by pixel; each finished layer moves along the Z axis, which defines the height, creating the following layers with the same sequence. 3D printing or projection stereolithography (DLP, laser, or LCD) uses a data projector to create each layer simultaneously and adheres it to the previously cured layer. The thickness of each layer is between 0.2 and 0.5 microns.

Upon finishing the three-dimensional object, the sample is removed from the aluminium plate, where it was created, and taken to a final post-cure, in a curing chamber, at a power of about 100 watts.

There are many applications for this microscale technique, including micro-bioreactors or, to support tissue growth, pharmaceutical microarrays and biochemical integrated circuits that could eventually simulate biological systems.

The three-dimensional objects obtained from 3D printing, with the composition that is the object of the present invention, have very useful functions in various disciplines, which include the dental and biomedical sectors, including surgical splints, models, aligners (transparent and Vita type colours), temporary and/or permanent crowns and/or covers.

Likewise, there is a method of improving the mechanical properties of the currently used resins, since none have nanorefrequency, which, together with the methodology used, provides perfect homogenization and adhesion to the curable liquid resin.

The improvement of the mechanical properties of the composition includes an increase in Young's modulus, strength, and hardness. This increase is between 10% and 300% depending on the percentage of reinforcement that is added; it also improves the modulus and resistance, as would be expected from a high aspect ratio fill. Only 5% by weight improved the interlaminar shear strength (ILSS) by 25% and the hardness was significantly improved at the same time.

Another interesting advantage is the dimensional stability provided by the invention, since the deformation by contraction of the object obtained by 3D printing is zero, unlike those currently existing, which have error margins due to said contraction.

In addition, the composition has antibacterial and antifungal properties and has the particularity of significantly improving optical properties, such as opalescence, luminescence, and opacity and other intrinsic properties, such as density and crystallinity.

Therefore, the composition has excellent structural applications in the dental field, such as discharge splints, bite splints, immediate load splints for implants, provisional implants, crowns, and definitive covers, as well as applications in other fields and areas.

The invention claimed is:

1. Radiation curable resin composition suitable for use in 3D printing characterized in that it is comprised of:
   40% to 60% by weight of at least one liquid epoxy resin, in which the liquid epoxy resins have at least two groups capable of reacting by a ring opening mechanism to form a polymer lattice,
   0.1% to 40% by weight of at least one liquid poly(meth)acrylate, wherein said liquid poly(meth)acrylate will be at most 50% by weight of a total content of (meth)acrylate,
   0.1% to 10% by weight of at least one cationic photoinitiator,
   0.1% to 10% by weight of at least one free-radical photoinitiator,
   5% to 15% by weight of at least one polyether provided with terminal OH groups,
   2% to 30% by weight of a compound that has at least one unsaturated group and at least one hydroxy group in its molecule,
   0% to 30% by weight of a hydroxylated compound that has no unsaturated group,
   0.1% to 5% graphene,
   0.1% to 20% by weight of halloysite nanotubes.

2. Composition of radiation curable resin according to claim 1, characterized in that at least one liquid epoxy resin is difunctional.

3. Radiation curable resin composition, according to claim 1, characterized in that at least one liquid epoxy resin has an epoxy functionality of at least 2.

4. Radiation curable resin composition, according to claim 1, characterized in that it is comprised of at least one polyester provided with terminal OH groups.

5. Radiation curable resin composition according to claim 1, characterized in that it is comprised of 5% to 15% by weight of at least one polyester provided with terminal OH groups.

6. Radiation curable resin composition, according to claim 1, characterized in that it is comprised of at least one polyurethane provided with terminal OH groups.

7. Radiation curable resin composition according to claim 1, characterized in that it is comprised of 5% to 15% by weight of at least one polyurethane provided with terminal OH groups.

8. Radiation curable resin composition according to claim 1, characterized in that the total weight percentage of polyether, polyester, or polyurethane is between 5% and 15%.

9. Radiation curable resin, according to claim 1, characterized in that it is comprised of an adhesive for adhering the graphene to a substrate.

10. Radiation curable resin composition, according to claim 1, characterized in that the graphene is graphene oxide.

11. Radiation curable resin composition, according to claim 1, characterized in that the graphene is functionalized graphene.

12. A method of obtaining the radiation curable resin composition defined in claim 1, the method comprising:

a) mixing of the following components: the liquid epoxy resins, the liquid poly(meth)acrylate, the at least one cationic photoinitiator, the at least one free-radical photoinitiator, the compound that has at least one unsaturated group and at least one hydroxyl group in its molecule, the hydroxylated compound that has no unsaturated group, polyether and at least one polyester or polyurethane components; wherein the mixing is carried out by means of a magnetic mixer and magnetic tablets are introduced into the mixture, b) pouring the mixture obtained in step a) into a sterile and opaque container, c) adding the graphene and the halloysite nanotubes to the mixture contained in the sterile and opaque container, d) closing container with a sterile and opaque lid, e) stirring the mixture in an ultrasound bath for the prepolymerization of the mixture obtained in step c), obtaining the radiation curable resin composition.

13. The method of obtaining the radiation curable resin composition according to claim 12, characterized in that the mixing with a magnetic mixer is done between 200 rpm and 800 rpm for 3 days.

14. The method of obtaining the radiation curable resin composition according to claim 12, characterized in that the nominal frequency of the ultrasound is between 25 to 45 kHz, the bath is at room temperature, and the mixing according to step e) in claim 12 lasts from 3 to 6 hours, time in which it reaches an average temperature between 35° C. and 60° C.

* * * * *